US012685102B2

(12) United States Patent
van der Straten et al.

(10) Patent No.: US 12,685,102 B2
(45) Date of Patent: Jul. 14, 2026

(54) ADVANCED PITCH INTERCONNECTS WITH MULTIPLE LOW ASPECT RATIO SEGMENTS

(71) Applicant: International Business Machines Corporation, Armonk, NY (US)

(72) Inventors: Oscar van der Straten, Guilderland Center, NY (US); Koichi Motoyama, Clifton Park, NY (US); Willie Lester Muchrison, Jr., Troy, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 618 days.

(21) Appl. No.: 18/146,478

(22) Filed: Dec. 27, 2022

(65) Prior Publication Data

US 2024/0213087 A1 Jun. 27, 2024

(51) Int. Cl.
| | |
|---|---|
| *H01L 21/768* | (2006.01) |
| *H01L 23/528* | (2006.01) |
| *H01L 23/532* | (2006.01) |

(52) U.S. Cl.
CPC .. *H01L 21/76843* (2013.01); *H01L 21/76802* (2013.01); *H01L 21/76846* (2013.01); *H01L 21/76865* (2013.01); *H01L 21/76877* (2013.01); *H01L 23/5283* (2013.01); *H01L 23/53295* (2013.01); *H01L 23/53209* (2013.01); *H01L 23/53266* (2013.01)

(58) Field of Classification Search
CPC ......... H01L 21/76843; H01L 21/76802; H01L 21/76846; H01L 21/76865; H01L 21/76877; H01L 23/5283; H01L 23/53295; H01L 23/53209; H01L 23/53266

See application file for complete search history.

(56) References Cited

U.S. PATENT DOCUMENTS

| | | | | |
|---|---|---|---|---|
| 4,840,923 A | * | 6/1989 | Flagello | H05K 3/0041 |
| | | | | 257/E21.575 |
| 5,818,110 A | * | 10/1998 | Cronin | H01L 21/76877 |
| | | | | 257/E21.585 |
| 6,731,007 B1 | | 5/2004 | Saito | |
| 8,119,519 B2 | * | 2/2012 | Kageyama | H01L 23/53238 |
| | | | | 257/E21.585 |
| 9,431,343 B1 | | 8/2016 | Lee | |
| 9,576,893 B2 | | 2/2017 | Huang | |

(Continued)

FOREIGN PATENT DOCUMENTS

| | | |
|---|---|---|
| CN | 114220767 A | 3/2022 |

OTHER PUBLICATIONS

Murugesan et al., "500 nm-sized Ni-TSV with Aspect Ratio 20 for Future 3D-LSIs_A Low-Cost Electroless—Ni Plating Approach", In 2019 30th Annual SEMI Advanced Semiconductor Manufacturing Conference (ASMC), IEEE, Conference Paper May 2019, DOI: 10.1109/ASMC.2019.8791781, 6 pages.

(Continued)

*Primary Examiner* — John M Parker

(74) *Attorney, Agent, or Firm* — Aaron N. Pontikos

(57) ABSTRACT

A semiconductor interconnect structure and formation thereof. The semiconductor interconnect structure includes a first high aspect ratio metal line. The first high aspect ratio metal line includes a first low aspect ratio line segment and a second low aspect ratio line segment.

9 Claims, 9 Drawing Sheets

(56) References Cited

U.S. PATENT DOCUMENTS

| | | | | |
|---|---|---|---|---|
| 9,691,660 | B2 | 6/2017 | Shaviv | |
| 9,837,314 | B2 | 12/2017 | Smith | |
| 10,056,328 | B2 | 8/2018 | Yu | |
| 10,665,503 | B2 | 5/2020 | Emesh | |
| 10,964,587 | B2 | 3/2021 | Lu | |
| 11,355,390 | B2 * | 6/2022 | Lee | H01L 23/5226 |
| 2013/0292836 | A1 * | 11/2013 | Tang | H01L 21/76838 |
| | | | | 257/773 |
| 2015/0162262 | A1 * | 6/2015 | Ting | H01L 21/76811 |
| | | | | 438/668 |
| 2017/0040296 | A1 * | 2/2017 | Das | H01L 23/49866 |
| 2020/0279806 | A1 | 9/2020 | Lin | |
| 2022/0359346 | A1 * | 11/2022 | Wang | H01L 23/481 |

OTHER PUBLICATIONS

Van der Veen et al., "Damascene benchmark of Ru, Co and Cu in scaled dimensions", In 2018 IEEE International Interconnect Technology Conference (IITC), 4 pages, IEEE, Conference Paper—Jun. 2018, DOI: 10.1109/IITC.2018.8430407.

Zhang et al., "Damage free integration of ultralow-κ dielectrics by template replacement approach", Applied Physics Letters, 107, 092901 (2015), doi: 10.1063/1.4930072, 5 pages.

* cited by examiner

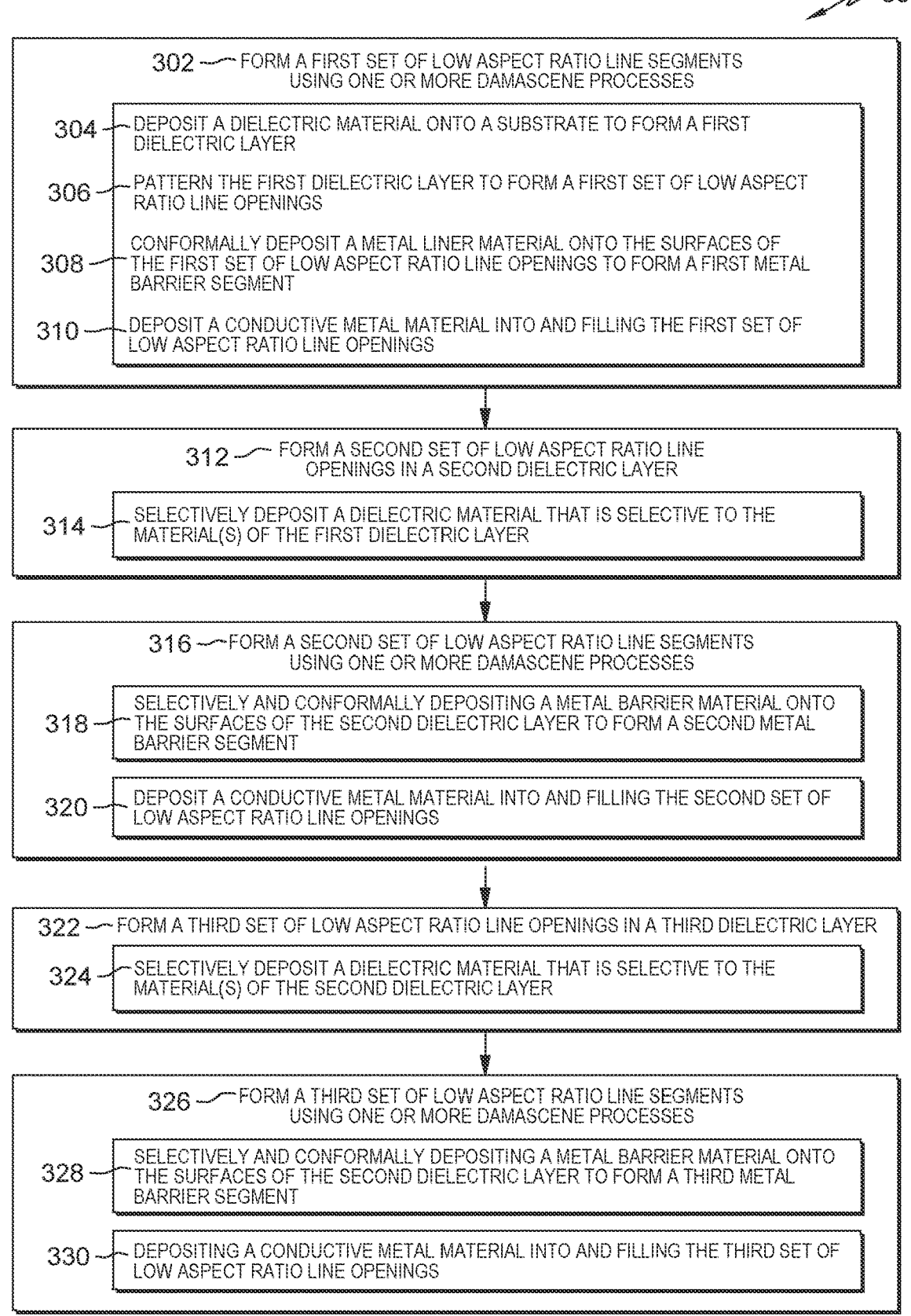

300

302 — FORM A FIRST SET OF LOW ASPECT RATIO LINE SEGMENTS
USING ONE OR MORE DAMASCENE PROCESSES

304 — DEPOSIT A DIELECTRIC MATERIAL ONTO A SUBSTRATE TO FORM A FIRST DIELECTRIC LAYER

306 — PATTERN THE FIRST DIELECTRIC LAYER TO FORM A FIRST SET OF LOW ASPECT RATIO LINE OPENINGS

308 — CONFORMALLY DEPOSIT A METAL LINER MATERIAL ONTO THE SURFACES OF THE FIRST SET OF LOW ASPECT RATIO LINE OPENINGS TO FORM A FIRST METAL BARRIER SEGMENT

310 — DEPOSIT A CONDUCTIVE METAL MATERIAL INTO AND FILLING THE FIRST SET OF LOW ASPECT RATIO LINE OPENINGS

312 — FORM A SECOND SET OF LOW ASPECT RATIO LINE OPENINGS IN A SECOND DIELECTRIC LAYER

314 — SELECTIVELY DEPOSIT A DIELECTRIC MATERIAL THAT IS SELECTIVE TO THE MATERIAL(S) OF THE FIRST DIELECTRIC LAYER

316 — FORM A SECOND SET OF LOW ASPECT RATIO LINE SEGMENTS USING ONE OR MORE DAMASCENE PROCESSES

318 — SELECTIVELY AND CONFORMALLY DEPOSITING A METAL BARRIER MATERIAL ONTO THE SURFACES OF THE SECOND DIELECTRIC LAYER TO FORM A SECOND METAL BARRIER SEGMENT

320 — DEPOSIT A CONDUCTIVE METAL MATERIAL INTO AND FILLING THE SECOND SET OF LOW ASPECT RATIO LINE OPENINGS

322 — FORM A THIRD SET OF LOW ASPECT RATIO LINE OPENINGS IN A THIRD DIELECTRIC LAYER

324 — SELECTIVELY DEPOSIT A DIELECTRIC MATERIAL THAT IS SELECTIVE TO THE MATERIAL(S) OF THE SECOND DIELECTRIC LAYER

326 — FORM A THIRD SET OF LOW ASPECT RATIO LINE SEGMENTS USING ONE OR MORE DAMASCENE PROCESSES

328 — SELECTIVELY AND CONFORMALLY DEPOSITING A METAL BARRIER MATERIAL ONTO THE SURFACES OF THE SECOND DIELECTRIC LAYER TO FORM A THIRD METAL BARRIER SEGMENT

330 — DEPOSITING A CONDUCTIVE METAL MATERIAL INTO AND FILLING THE THIRD SET OF LOW ASPECT RATIO LINE OPENINGS

FIG. 3

ADVANCED PITCH INTERCONNECTS WITH MULTIPLE LOW ASPECT RATIO SEGMENTS

BACKGROUND OF THE INVENTION

The present invention relates generally to the field of semiconductor devices, and more particularly to interconnect structures formed from multiple low aspect ratio segments.

An integrated circuit (IC) device may be formed with millions of transistors and other circuit elements that are fabricated on a single silicon crystal substrate (wafer). For the IC device to be functional, multi-level or multi-layered interconnection schemes such as, for example, metal wiring formed by single damascene processes, dual damascene processes, subtractive etch processes, and combinations thereof, are fabricated in the back-end-of-the-line (BEOL) of the device to connect the circuit elements distributed on the surface of the device.

As ICs continue to move to smaller technology nodes, the ability to maintain and/or increase signal density to meet performance demands becomes increasingly challenging, especially when forming interconnects in the lower metal layers of the BEOL.

SUMMARY

According to one embodiment of the present invention, a semiconductor interconnect structure is provided. The semiconductor interconnect structure includes a first high aspect ratio metal line. The first high aspect ratio metal line includes a first low aspect ratio line segment and a second low aspect ratio line segment.

According to another embodiment of the present invention, a method of forming a semiconductor interconnect structure is provided. The method includes forming a first low aspect ratio line segment in a first dielectric layer. The method further includes forming a second low aspect ratio line segment in a second dielectric layer. The second low aspect ratio line segment is formed on top of and in vertical alignment with the first low aspect ratio line segment.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

FIGS. 3 and 4, generally designated 300 and 400, respectfully, are methods of fabricating semiconductor interconnect structures corresponding to the semiconductor structures described with reference to FIGS. 1A-1G . . . 2A-2H. The methods 300 and 400 may be used in conjunction with, for example, any of the exemplary fabrication sequences of FIGS. 1A-1G . . . 2A-2H.

When viewed as ordered combinations, FIGS. 1A-1G . . . 2A-2H, and FIGS. 3 and 4 illustrate both (i) semiconductor interconnect structures and (ii) the methods for forming such semiconductor interconnect structures, in accordance with illustrative embodiments.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
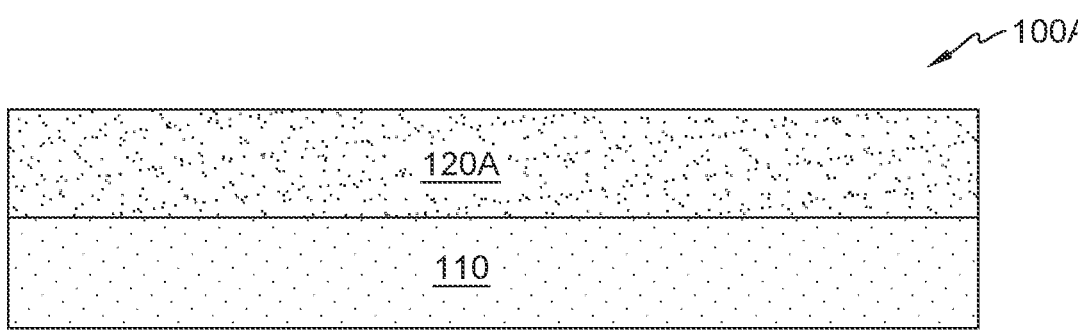
FIG. 1A illustrates a cross-sectional view of an initial semiconductor structure, generally designated 100A, in accordance with at least one embodiment of the present invention.

For back-end-of-the-line (BEOL) processing of lines having a pitch below 30 nanometers (nm), the wiring scheme becomes more complex, mainly because there are more transistors to connect with an ever tighter pitch. Shrinking dimensions also means the wires have a reduced cross-sectional area, which drives up the resistance-capacitance product (RC) of the interconnect system, and results in increased signal delay. Currently, the use of non-copper (Cu) metallization materials, such as ruthenium (Ru) have been used to achieve lower line resistance (R). However, the use of alternative metallization materials negatively results in increased line wiggling (i.e., variability in line width and height) caused by the additional metal stress from these alternative metallization materials. This increased line wiggling is even more pronounced in high aspect ratio (AR) lines having tighter pitches.

Embodiments of the present invention provide for improved interconnect structures and methods of forming the same having high aspect ratio lines that exhibit significantly less line wiggling, if any. According to embodiments of the present invention, high aspect ratio lines are formed by stacking multiple low aspect ratio line segments on top of each other. For example, a first set of low aspect ratio line segments are formed as follows: a first set of low aspect ratio line openings are formed in a first dielectric layer, and a first metallization process is performed to form the first set of low aspect ratio line segments therein. Thereafter, a second set of low aspect ratio line segments are formed on top of the first set of low aspect ratio line segments as follows: a second dielectric layer is selectively formed on top of the first dielectric layer, thereby forming a second set of low aspect ratio line openings above the first set of low aspect ratio line segments, and a second metallization process is performed to form the second set of low aspect ratio line segments therein. This process may be repeated any number of times depending on the desired height of the high aspect ratio lines of the interconnect structure.

Rather than forming high aspect ratio lines in a single metallization process, by forming high aspect ratio lines from multiple low aspect ratio line segments formed over multiple, separate metallization processes, several benefits over current interconnect structures and methods of forming the same are achieved. These benefits may include, but are not limited to: increased scalability of advanced logic elements due to a reduction and/or elimination of line wiggling, and therefore increased uniformity in line width and height of metal wiring, improved device performance due to reduced metal wire shorts, decreased line resistance, and improved metal fill having little to no voids.

Exemplary embodiments now will be described more fully herein with, reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 4:
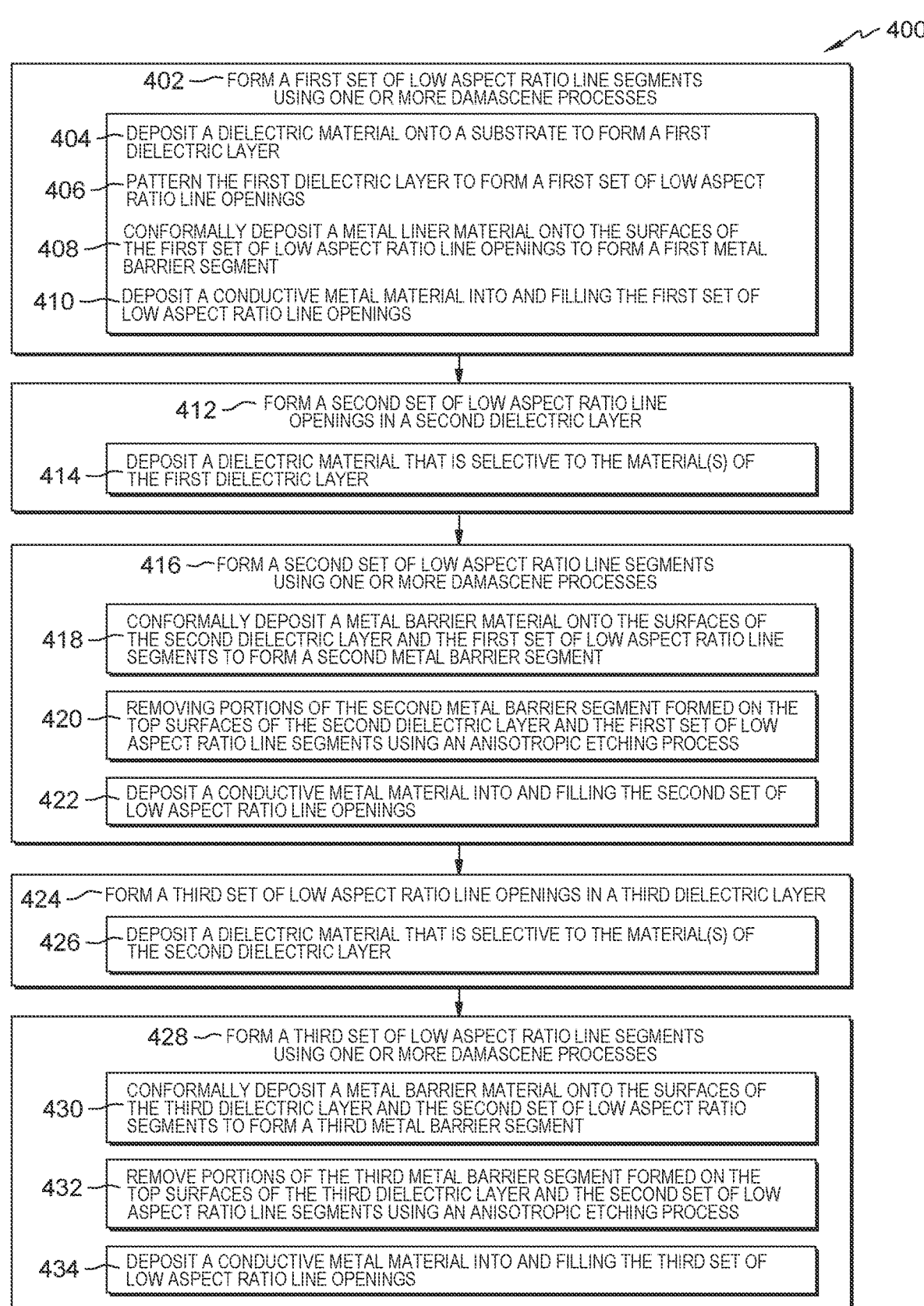

As described below, in conjunction with FIGS. 1A-1G . . . 2A-2H, FIG. 3, and FIG. 4, embodiments of the present invention include semiconductor interconnect structures and methods of forming such semiconductor interconnect structures, and in particular, semiconductor interconnect structures having high aspect ratio metal lines formed from multiple low aspect ratio line segments. The methods described below in conjunction with FIGS. 3 and 4 May be incorporated into typical semiconductor logic and memory device fabrication processes. As such, when viewed as ordered combinations, FIGS. 3 and 4 illustrate methods for forming semiconductor interconnect structures having increased design flexibility.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of microcooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

As used herein, the term signal via may refer to a via that carries signals between two different lines located in two different metal levels. For example, a signal via may transfer signals from a first line located in a first metal level to a second line located in a second metal level.

As used herein, the term power via may refer to a via that carries power between two different lines located in two different metal levels. For example, a power via may transfer power (i.e., power and/or ground) from a first line located in a first metal level to a second line located in a second metal level.

As used herein, the term signal line may refer to a line (i.e., metal line or interconnect) in the back-end-of-the-line (BEOL) of a semiconductor device used to distribute signals between two or more individual devices (e.g., transistors, capacitors, or resistors).

As used herein, the term power line may refer to a line (i.e., metal line or interconnect) in the back-end-of-the-line (BEOL) of a semiconductor device used to distribute power (i.e., power and/or ground) between two or more individual devices (e.g., transistors, capacitors, or resistors).

As used herein, the terms "metal level," "metal layer," "metallization layer," and "backside metal (BSM) layer" May be used interchangeably and may refer to one of a plurality of metal wiring levels in the BEOL of a semiconductor device.

The present invention will now be described in detail with reference to the Figures. FIGS. 1A-1G . . . 2A-2H include various cross-sectional views depicting illustrative steps of methods for manufacturing semiconductor devices and the resulting semiconductor devices according to select embodiments of the present invention. One having ordinary skill in the art will appreciate that there are many options available for the formation of the structures described herein and that the following discussion does not limit embodiments to only the techniques described herein.

Referring now to FIGS. 1A-1G, FIG. 1A illustrates a cross-sectional view of an initial semiconductor structure, generally designated 100A, in accordance with at least one embodiment of the present invention. In assembly of semiconductor structure 100A, a dielectric material is deposited onto a substrate 110 to form a dielectric layer 120A.

In some embodiments, substrate 110 may include a front-end-of-the-line (FEOL) structure. A FEOL structure is typically present beneath the lowest level of the multilayered interconnect structure and includes a semiconductor substrate having one or more semiconductor devices such as, for example, transistors, capacitors, resistors, and etc. located thereon. In other embodiments, substrate 110 may include one or more interconnect levels of a multilayered interconnect structure, such as a back-end-of-the-line (BEOL) structure. A BEOL structure is typically where the individual semiconductor devices in the FEOL structure are interconnected with one another. In such embodiments, each interconnect level may include one or more electrically conductive structures embedded in an interconnect dielectric material. For example, the one or more interconnect levels of a multilayer interconnect structure may be formed from any generally known semiconductor materials, such as silicon, gallium arsenide, or germanium.

In some embodiments, and as depicted in FIG. 1A, substrate 110 is a bulk semiconductor wafer, such as a bulk silicon (Si), bulk germanium (Ge), bulk silicon germanium (SiGe) and/or bulk III-V semiconductor wafer. Alternatively, in other embodiments, substrate 110 is a semiconductor-on-insulator (SOI) wafer. A SOI wafter includes a SOI layer separated from a substrate by a buried insulator. When the buried insulator is an oxide, it is referred to herein as a buried oxide or BOX. The SOI layer can include any suitable semiconductor, such as Si, Ge, SiGe, and/or a III-V semiconductor.

Dielectric layer 120A may be composed of an inorganic dielectric material or an organic dielectric material. In some embodiments, dielectric layer 120A may be porous. In other embodiments, dielectric layer 120A may be non-porous. In some embodiments, dielectric layer 120A may have a dielectric constant (all dielectric constants mentioned herein are measured relative to a vacuum, unless otherwise stated) that is about 4.0 or less. In an embodiment, dielectric layer 120A may have a dielectric constant of 2.8 or less. These dielectrics having a dielectric constant of 2.8 or less generally have a lower parasitic cross talk as compared to dielectric materials whose dielectric constant is greater than 4.0. Examples of suitable dielectric materials that may be employed as dielectric layer 120A include, but are limited to, porous silicates, silicon dioxides, silicon oxynitrides, silicon carbides, silicon nitrides, silicon undoped or doped silicate glass, silsesquioxanes, carbon doped oxides (i.e., organosilicates) that include atoms of Si, C, O and H, and variants thereof, siloxanes, parylene, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

Figure 1B:
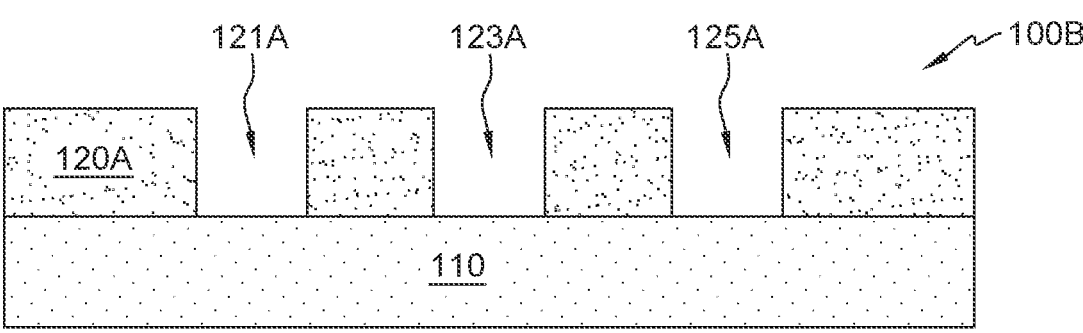
FIG. 1B illustrates a cross-sectional view of semiconductor structure 100A depicted in FIG. 1A after performing subsequent processing steps, generally designated 100B, in accordance with at least one embodiment of the present invention.

FIG. 1B illustrates a cross-sectional view of semiconductor structure 100A depicted in FIG. 1A after performing subsequent processing steps, generally designated 100B, in accordance with at least one embodiment of the present invention. In assembly of semiconductor structure 100B, dielectric layer 120A is patterned using one or more damascene processes to form a first set of low aspect ratio line openings 121A, 123A, 125A.

The one or more damascene processes performed to form the first set of low aspect line openings 121A, 123A, 125A within dielectric layer 120A may be performed as follows. A hard mask layer (not depicted) is formed by depositing a hard mask material (e.g., silicon nitride, titanium nitride, tantalum nitride, or any suitable metal-containing material) onto the top surface of dielectric layer 120A. The hard mask layer can be formed utilizing a deposition process including, but not limited to, CVD, PECVD, ALD, physical vapor deposition (PVD) or sputtering.

A photoresist material (not depicted) is then deposited onto the surface of the hard mask layer. The photoresist material can be applied by any suitable techniques, including, but not limited to, coating or spin-on techniques. A photomask (not depicted) patterned with shapes defining line openings 121A, 123A, 125A to be formed is placed over the photoresist material, and the photomask pattern is transferred to the photoresist material using a lithographic process, which creates recesses in the uncovered regions of the photoresist material. The resulting patterned photoresist material is subsequently used to create the same pattern in the hard mask layer. Dry etch techniques (for example, an anisotropic etch process, such as reactive ion etch) may be employed to selectively remove portions of the hard mask layer to form the patterned hard mask. After formation of the patterned hard mask, the photoresist material may be stripped from the patterned hard mask by ashing or other suitable processes. The resulting structure may be subjected to a wet clean.

The resulting patterned hard mask, which acts as an etch mask, is formed such that the portions of the underlying dielectric layer 120A corresponding to line openings 121A, 123A, 125A to be formed are protected by the patterned hard mask, while the remaining portions of the underlying dielectric layer 120A are left exposed. During patterning of dielectric layer 120A using the patterned hard mask, the physically exposed portions of dielectric layer 120A are removed by an anisotropic etching process such as, for example, reactive ion etching (RIE), ion beam etching (IBE), chemical wet etching, or a combination of IBE and chemical wet etching to form the first set of low aspect ratio line openings 121A, 123A, 125A.

Figure 1C:
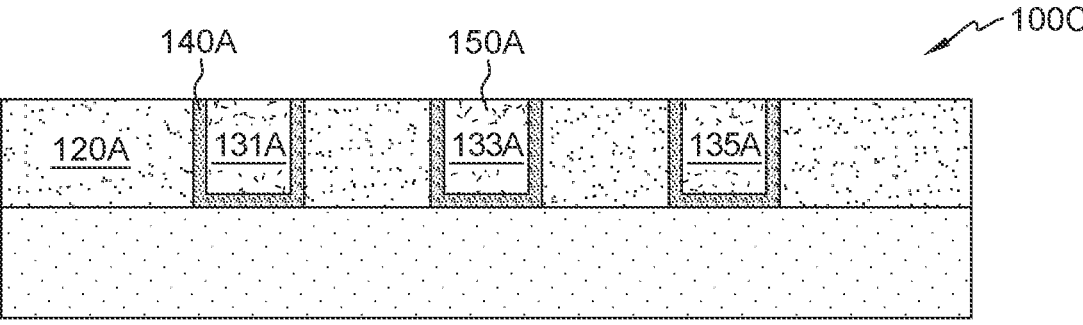
FIG. 1C illustrates a cross-sectional view of semiconductor structure 100B depicted in FIG. 1B after performing subsequent processing steps, generally designated 100C, in accordance with at least one embodiment of the present invention.

FIG. 1C illustrates a cross-sectional view of semiconductor structure 100B depicted in FIG. 1B after performing subsequent processing steps, generally designated 100C, in accordance with at least one embodiment of the present invention. In assembly of semiconductor structure 100C, a metal liner material is conformally deposited onto the exposed surfaces of the patterned dielectric layer 120A, a conductive metal material is deposited within and filling the first set of low aspect ratio line openings 121A, 123A, 125A (depicted in FIG. 1B), followed by a planarization process to form a first set of low aspect ratio line segments 131A, 133A, 135A.

After patterning dielectric layer 120A, a metal barrier material is conformally deposited onto the exposed surfaces of the patterned dielectric layer 120A to form a barrier layer 140A. Barrier layer 140A may include one or more thin layers of material such as, for example, tantalum (Ta), tantalum nitride (TaN), titanium nitride (TiN), hafnium nitride (HfN), cobalt (Co), ruthenium (Ru), tungsten (W), tungsten nitride (WN), titanium-tungsten (TiW), tungsten nitride (WN) manganese (Mn), manganese nitride (MnN) or other barrier materials (or combinations of barrier materials) such as RuTaN, Ta/TaN, CoWP, NiMoP, or NiMoB which are suitable for the given application. The thin metal barrier serves as a barrier diffusion layer and adhesion layer. A conformal layer of a metal barrier material may be deposited using known techniques including, but not limited to, chemical vapor deposition (CVD), plasma enhanced chemical vapor deposition (PECVD), atomic layer deposition (ALD), physical vapor deposition (PVD), sputtering, chemical solution deposition or plating. The thickness of barrier layer 140A may vary depending on the deposition process used, as well as the material employed. In some embodiments, barrier layer 140A may have a thickness from 2 nm to 50 nm. However, other thicknesses that are less than 2 nm, or greater than 50 nm can also be employed in embodiments of the present invention.

After forming barrier layer 140A, a conductive metal layer 150A is formed by depositing (e.g., via atomic layer deposition (ALD), chemical vapor deposition (CVD), plasma enhanced CVD (PECVD), or any other suitable deposition techniques) a conductive metal material within and filling line openings 121A, 123A, 125A of the patterned dielectric layer 120A. In an embodiment, the conductive metal material may be a metal or metal alloy including, but not limited to, copper (Cu), aluminum (Al), ruthenium (Ru), rhodium (Rh), iridium (Ir), tungsten (W), molybdenum (Mo), nickel (Ni), or an alloy thereof, such as, for example, a Cu—Al alloy.

A planarization process such as, for example, chemical mechanical planarization or polishing (CMP) and/or grinding, may subsequently be performed to remove portions of barrier layer 140A and conductive metal layer 150A located above the top surface of dielectric layer 120A. The planarization stops at the top surface of dielectric layer 120A, such that the top surface of the first set of low aspect ratio line segments 131A, 133A, 135A is substantially coplanar with the top surface dielectric layer 120A.

Figure 1D:
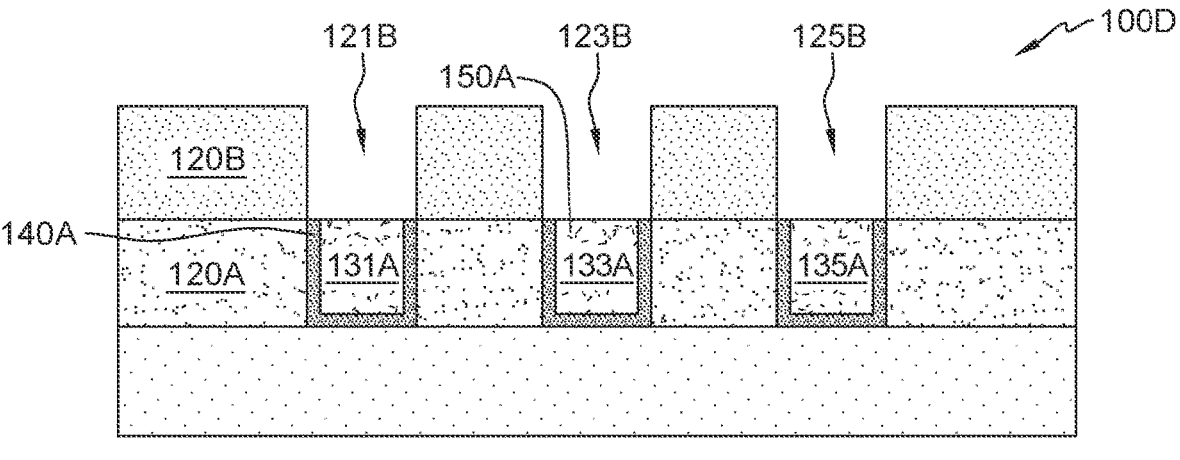
FIG. 1D illustrates a cross-sectional view of semiconductor structure 100C depicted in FIG. 1C after performing subsequent processing steps, generally designated 100D, in accordance with at least one embodiment of the present invention.

FIG. 1D illustrates a cross-sectional view of semiconductor structure 100C depicted in FIG. 1C after performing subsequent processing steps, generally designated 100D, in accordance with at least one embodiment of the present invention. In assembly of semiconductor structure 100D, a dielectric material is selectively deposited onto the top surface dielectric layer 120A to form a dielectric layer 120B having a second set of low aspect ratio line openings 121B, 123B, 125B. As depicted by FIG. 1D, the second set of low aspect ratio line openings 121B, 123B, 125B are formed above and in vertical alignment with the first set of low aspect ratio line segments 131A, 133A, 135A, respectively.

In forming dielectric layer 120B, a dielectric material that is selective to the material(s) of dielectric layer 120A over the material(s) of barrier layer 140A and conductive metal layer 150A is deposited (e.g., via selective atomic layer deposition (ALD), selective chemical vapor deposition (CVD) or any other suitable deposition techniques) onto the top surface of dielectric layer 120A. Dielectric layer 120B may be formed using any material(s) that are selective to the material(s) of dielectric layer 120A over the material(s) of barrier layer 140A and conductive metal layer 150A. For example, if dielectric layer 120A is formed from SiCOH, barrier layer 140A is formed from TaN, and conductive metal layer 150A is formed from copper (Cu), parylene may be used to form dielectric layer 120B since parylene is selective to SiCOH over TaN and Cu. In some embodiments, and as depicted by FIG. 1D, dielectric layer 120B and dielectric layer 120A are formed from different materials. In other embodiments, dielectric layer 120B and dielectric layer 120A are formed from the same material(s).

Figure 1E:
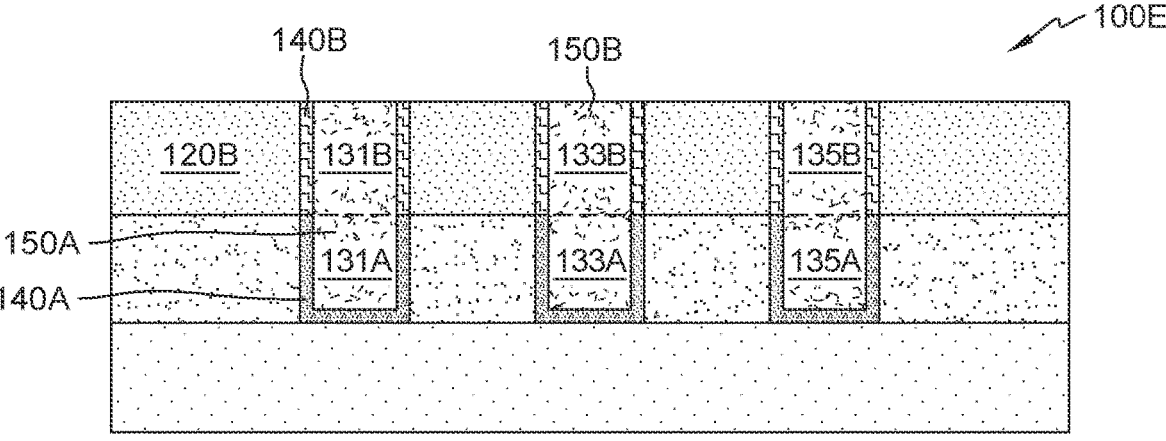
FIG. 1E illustrates a cross-sectional view of semiconductor structure 100D depicted in FIG. 1D after performing subsequent processing steps, generally designated 100E, in accordance with at least one embodiment of the present invention.

FIG. 1E illustrates a cross-sectional view of semiconductor structure 100D depicted in FIG. 1D after performing subsequent processing steps, generally designated 100E, in accordance with at least one embodiment of the present invention. In assembly of semiconductor structure 100E, a metal barrier material is selectively and conformally deposited onto the exposed surfaces of the patterned dielectric layer 120B, a conductive metal material is deposited within and filling the second set of low aspect ratio line openings 121B, 123B, 125B (depicted in FIG. 1D), followed by a planarization process to form a second set of low aspect ratio line segments 131B, 133B, 135B. As depicted by FIG. 1E, the second set of low aspect ratio line segments 131B, 133B, 135B are in contact and in vertical alignment with the first set of low aspect ratio line segments 131A, 133A, 135A, respectively.

After forming dielectric layer 120B, a metal barrier material is conformally and selectively deposited onto the exposed surfaces of the patterned dielectric layer 120B to form a barrier layer 140B. In forming barrier layer 140B, a metal barrier material that is selective to the material(s) of dielectric layer 120B over the material(s) of conductive metal layer 150A is deposited (e.g., via selective atomic layer deposition (ALD), selective chemical vapor deposition (CVD) or any other suitable deposition techniques) onto the top surface of dielectric layer 120B. Barrier layer 140B may be formed using any material(s), including, but not limited to those listed above with respect to barrier 140A, that are selective to the material(s) of dielectric layer 120B over the material(s) of conductive metal layer 150A. For example, if dielectric layer 120B is formed from parylene and conductive metal layer 150A is formed from copper (Cu), TaN may be used to form barrier layer 140B since TaN is selective to parylene over Cu. In some embodiments, and as depicted by FIG. 1E, barrier layer 140B and barrier layer 140A are formed from different materials. In other embodiments, barrier layer 140B and barrier layer 140A are formed from the same material(s).

A conductive metal layer 150B is then formed by depositing (e.g., via atomic layer deposition (ALD), chemical vapor deposition (CVD), plasma enhanced CVD (PECVD), or any other suitable deposition techniques) a conductive metal material within and filling line openings 121B, 123B, 125B of the patterned dielectric layer 120B. In an embodiment, the conductive metal material may be a metal or metal alloy including, but not limited to, copper (Cu), aluminum (Al), ruthenium (Ru), rhodium (Rh), iridium (Ir), tungsten (W), molybdenum (Mo), nickel (Ni), or an alloy thereof, such as, for example, a Cu—Al alloy. In some embodiments, and as depicted by FIG. 1E, conductive metal layer 150B and conductive metal layer 150A are formed from the same material(s). In other embodiments, conductive metal layer 150B and conductive metal layer 150A are formed from different materials.

A planarization process such as, for example, chemical mechanical planarization or polishing (CMP) and/or grinding, may subsequently be performed to remove portions of barrier layer 140B and conductive metal layer 150B located above the top surface of dielectric layer 120B.

The planarization stops at the top surface of dielectric layer 120B, such that the top surface of the second set of low aspect ratio line segments 131B, 133B, 135B is substantially coplanar with the top surface dielectric layer 120B.

Figure 1F:
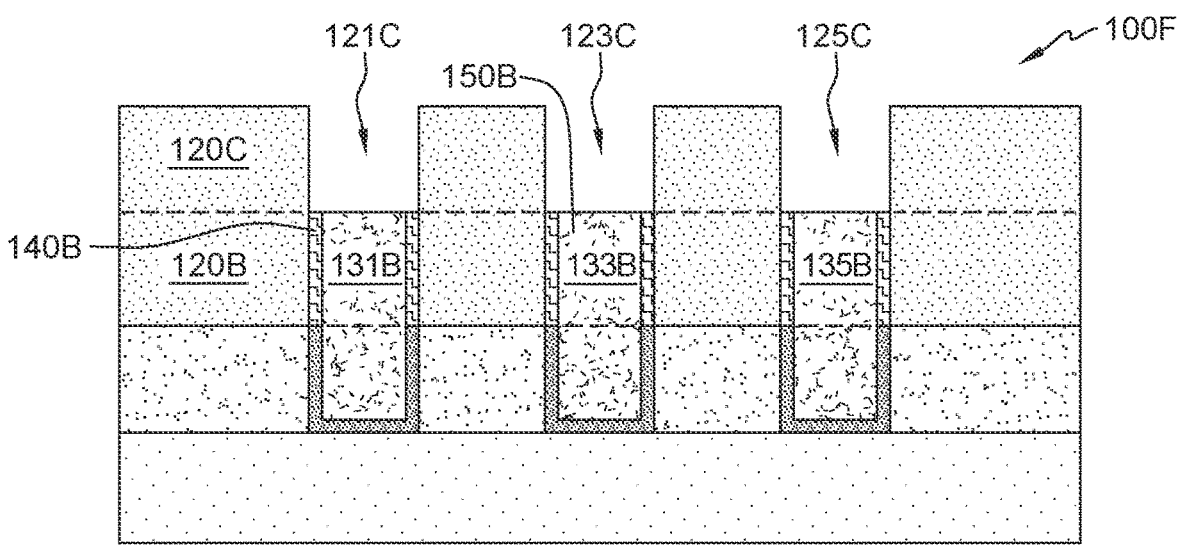
FIG. 1F illustrates a cross-sectional view of semiconductor structure 100E depicted in FIG. 1E after performing subsequent processing steps, generally designated 100F, in accordance with at least one embodiment of the present invention.

FIG. 1F illustrates a cross-sectional view of semiconductor structure 100E depicted in FIG. 1E after performing subsequent processing steps, generally designated 100F, in accordance with at least one embodiment of the present invention. In assembly of semiconductor structure 100F, a dielectric material is selectively deposited onto the top surface of dielectric layer 120B to form a dielectric layer 120C having a third set of low aspect ratio line openings 121C, 123C, 125C. As depicted by FIG. 1F, the third set of low aspect ratio line openings 121C, 123C, 125C are formed above and in vertical alignment with the second set of low aspect ratio line segments 131B, 133B, 135B, respectively.

In forming dielectric layer 120C, a dielectric material that is selective to the material(s) of dielectric layer 120B over the material(s) of barrier layer 140B and conductive metal layer 150B is deposited (e.g., via selective atomic layer deposition (ALD), selective chemical vapor deposition (CVD) or any other suitable deposition techniques) onto the top surface of dielectric layer 120B. Dielectric layer 120C may be formed using any material(s) including, but not limited, to those listed above with respect to dielectric layer 120A, that are selective to the material(s) of dielectric layer 120B over the material(s) of barrier layer 140B and conductive metal layer 150B. In some embodiments, and as depicted by FIG. 1F, dielectric layer 120C and dielectric layer 120B are formed from the same materials. In other embodiments, dielectric layer 120C and dielectric layer 120B are formed from different materials.

Figure 1G:
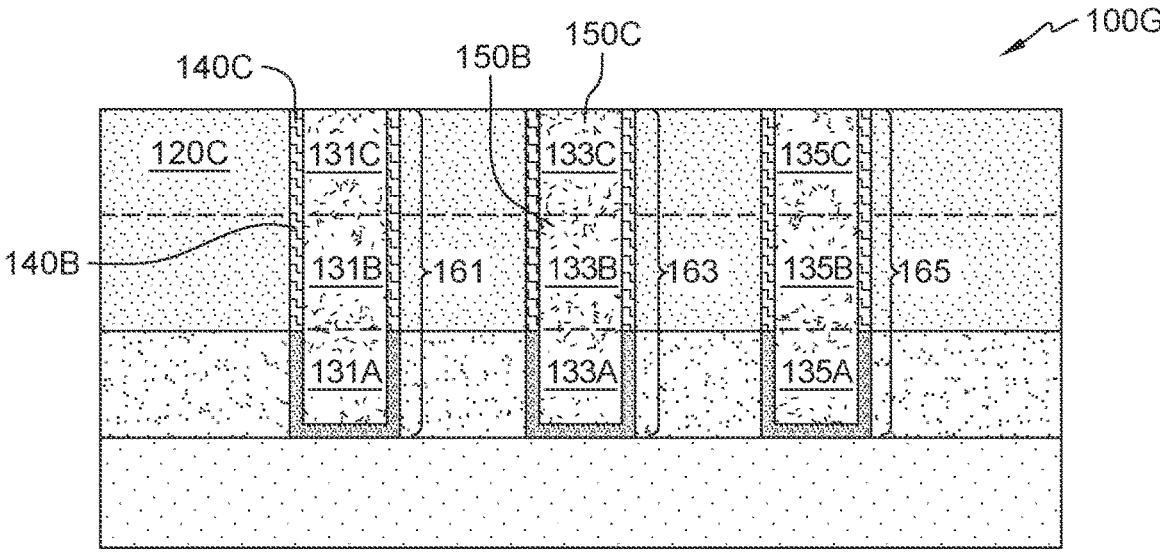
FIG. 1G illustrates a cross-sectional view of semiconductor structure 100F depicted in FIG. 1F after performing subsequent processing steps, generally designated 100G, in accordance with at least one embodiment of the present invention.

FIG. 1G illustrates a cross-sectional view of semiconductor structure 100F depicted in FIG. 1F after performing subsequent processing steps, generally designated 100G, in accordance with at least one embodiment of the present invention. In assembly of semiconductor structure 100G, a metal barrier material is selectively and conformally deposited onto the exposed surfaces of the patterned dielectric layer 120C, a conductive metal material is deposited within and filling the third set of low aspect ratio line openings 121C, 123C, 125C (depicted in FIG. 1E), followed by a planarization process to form a third set of low aspect ratio line segments 131C, 133C, 135C. As depicted by FIG. 1E, the third set of low aspect ratio line segments 131C, 133C, 135C are in contact and in vertical alignment with the second set of low aspect ratio line segments 131B, 133B, 135B, respectively.

After forming dielectric layer 120C, a metal barrier material is conformally and selectively deposited onto the exposed surfaces of the patterned dielectric layer 120C to form a barrier layer 140C. In forming barrier layer 140C, a metal barrier material that is selective to the material(s) of dielectric layer 120C over the material(s) of conductive metal layer 150B is deposited (e.g., via selective atomic layer deposition (ALD), selective chemical vapor deposition (CVD) or any other suitable deposition techniques) onto the top surface of dielectric layer 120C. Barrier layer 140C may be formed using any material(s), including, but not limited to those listed above with respect to barrier 140A, that are selective to the material(s) of dielectric layer 120C over the material(s) of conductive metal layer 150B. In some embodiments, and as depicted by FIG. 1E, barrier layer 140C and barrier layer 140B are formed from the same materials. In other embodiments, barrier layer 140C and barrier layer 140B are formed from different material(s).

A conductive metal layer 150C is then formed by depositing (e.g., via atomic layer deposition (ALD), chemical vapor deposition (CVD), plasma enhanced CVD (PECVD), or any other suitable deposition techniques) a conductive metal material within and filling line openings 121C, 123C, 125C of the patterned dielectric layer 120C. In an embodiment, the conductive metal material may be a metal or metal alloy including, but not limited to, copper (Cu), aluminum (Al), ruthenium (Ru), rhodium (Rh), iridium (Ir), tungsten (W), molybdenum (Mo), nickel (Ni), or an alloy thereof, such as, for example, a Cu—Al alloy. In some embodiments, and as depicted by FIG. 1E, conductive metal layer 150C and conductive metal layer 150B are formed from the same material(s). In other embodiments, conductive metal layer 150C and conductive metal layer 150B are formed from different materials.

A planarization process such as, for example, chemical mechanical planarization or polishing (CMP) and/or grinding, may subsequently be performed to remove portions of barrier layer 140C and conductive metal layer 150C located above the top surface of dielectric layer 120C. The planarization stops at the top surface of dielectric layer 120C, such that the top surface of the third set of low aspect ratio line segments 131C, 133C, 135C is substantially coplanar with the top surface dielectric layer 120C.

As depicted by FIG. 1G, a plurality of high aspect ratio metal lines that are substantially uniform in height and width are formed from multiple low aspect ratio line segments. A first high aspect ratio metal line 161 is formed from low aspect ratio line segments 131A, 131B, and 131C. A second high aspect ratio metal line 163 is formed from low aspect ratio line segments 133A, 133B, and 133C. A third high aspect ratio metal line 165 is formed from low aspect ratio line segments 135A, 135B, and 135C. Although first, second, and third high aspect ratio metal lines 161, 163, 165 are depicted as being formed from three low aspect ratio line segments, embodiments of the present invention are not limited to high aspect ratio metal lines formed from three low aspect ratio line segments. Rather, embodiments of the present invention may contemplate high aspect ratio metal lines formed from more or less than three low aspect ratio line segments. In an embodiment, high aspect ratio metal lines are formed from at least two low aspect ratio line segments. The total number of low aspect ratio lines segments used to form a single high aspect ratio metal line may vary depending on the desired height of the high aspect ratio lines of the interconnect structure. In an embodiment, the pitch between first and second high aspect ratio metal lines, and the pitch between second and third high aspect ratio metal lines is less than 30 nanometers. In an embodiment, the pitch between first and second high aspect ratio metal lines 161, 163, and the pitch between second and third high aspect ratio metal lines 163, 165, is less than 30 nanometers. In an embodiment, the pitch between first and second high aspect ratio metal lines 161, 163, and the pitch between second and third high aspect ratio metal lines 163, 165, is greater than or equal to 30 nanometers.

Figures 2A, 2B:
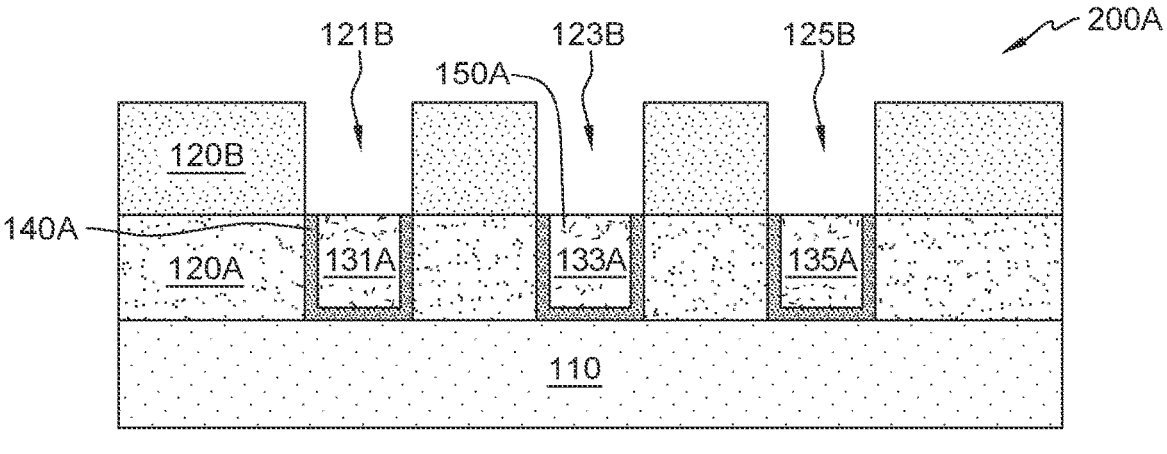
FIG. 2A illustrates a cross-sectional view of an initial semiconductor structure, generally designated 200A, in accordance with at least one embodiment of the present invention.
FIG. 2B illustrates a cross-sectional view of semiconductor structure 200A depicted in FIG. 2A after performing subsequent processing steps, generally designated 200B, in accordance with at least one embodiment of the present invention.

FIG. 2A illustrates a cross-sectional view of an initial semiconductor structure, generally designated 200A, in accordance with at least one embodiment of the present invention. It should be noted that semiconductor structure 200A is equivalent to semiconductor structure 100D depicted in FIG. 1D. Accordingly, semiconductor structure 200A may be formed from the same processes and materials as described above with reference to semiconductor structures 100A, 100B, 100C, and 100D of FIGS. 1A, 1B, 1C, and 1D, respectively.

As depicted by FIG. 2A, semiconductor structure 200A includes dielectric layer 120A formed on substrate 110. After patterning dielectric layer 120A to form the first set of low aspect ratio line openings 121A, 123A, 125A (depicted in FIG. 1B), metal barrier 140A was formed by depositing a metal barrier material on the exposed surfaces of the patterned dielectric layer 120A, conductive metal layer 150A was formed by depositing a conductive metal material within and filling the first set of low aspect ratio line openings 121A, 123A, 125A, a planarization process was performed to remove portions of barrier layer 140A and conductive metal layer 150A located above the top surface of dielectric layer 120A to form first set of low aspect line segments 131A, 133A, 135A. Thereafter, a second set of low aspect line openings 121B, 123B, 125B were formed in dielectric layer 120B by selectively depositing a dielectric material onto the top surface of dielectric layer 120A.

FIG. 2B illustrates a cross-sectional view of semiconductor structure 200A depicted in FIG. 2A after performing subsequent processing steps, generally designated 200B, in accordance with at least one embodiment of the present invention. In assembly of semiconductor structure 200B, a metal barrier material is formed.

Barrier layer 240B may be formed by conformally depositing a metal barrier material (e.g., via atomic layer deposition (ALD), chemical vapor deposition (CVD), plasma enhanced CVD (PECVD), or any other suitable deposition techniques) onto the exposed surfaces of the patterned dielectric layer 120B and conductive metal layer 150A. Barrier layer 240B may be formed using material(s) including, but not limited to, those listed above with respect to barrier 140A. In some embodiments, and as depicted by FIG. 2B, barrier layer 240B and barrier layer 140A are formed from the same material(s). In other embodiments, barrier layer 240B and barrier layer 140A are formed from different materials.

Figure 2C:
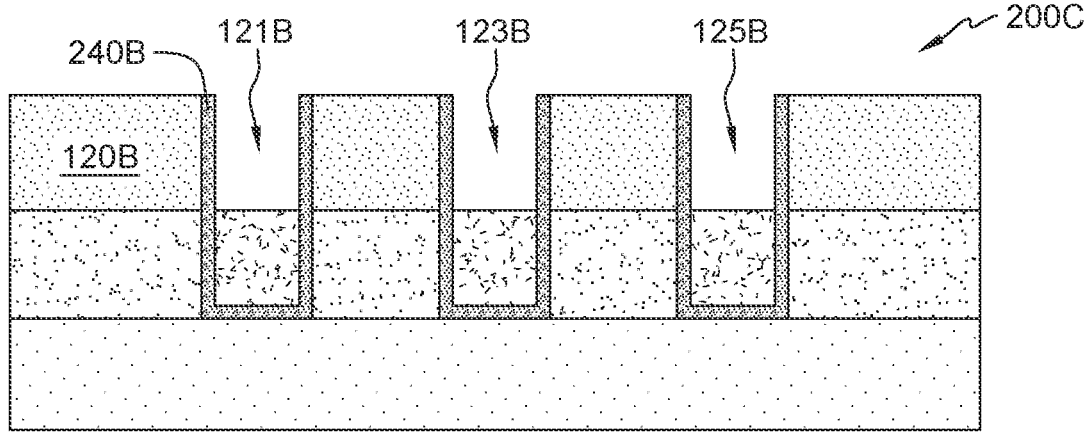
FIG. 2C illustrates a cross-sectional view of semiconductor structure 200B depicted in FIG. 2B after performing subsequent processing steps, generally designated 200C, in accordance with at least one embodiment of the present invention.

FIG. 2C illustrates a cross-sectional view of semiconductor structure 200B depicted in FIG. 2B after performing subsequent processing steps, generally designated 200C, in accordance with at least one embodiment of the present invention. In assembly of semiconductor structure 200C, portions of barrier layer 240B previously formed on the top surfaces of dielectric layer 120B and conductive metal layer 150A are removed by an anisotropic etching process such as, for example, reactive ion etching (RIE), ion beam etching (IBE), chemical wet etching, or a combination of IBE and chemical wet etching.

Figure 2D:
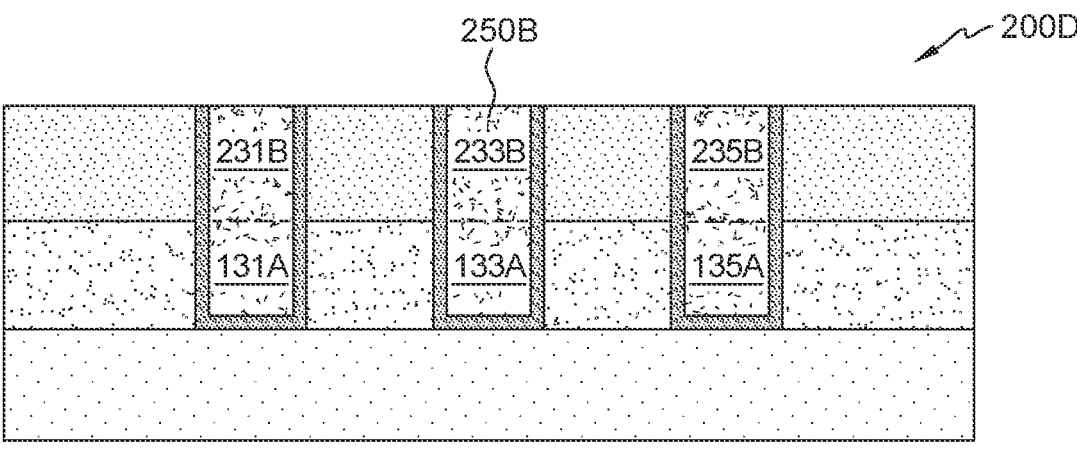
FIG. 2D illustrates a cross-sectional view of semiconductor structure 200C depicted in FIG. 2C after performing subsequent processing steps, generally designated 200D, in accordance with at least one embodiment of the present invention.

FIG. 2D illustrates a cross-sectional view of semiconductor structure 200C depicted in FIG. 2C after performing subsequent processing steps, generally designated 200D, in accordance with at least one embodiment of the present invention. In assembly of semiconductor structure 200D, a conductive metal layer 250B is formed by depositing a conductive metal material within and filling the second set of low aspect ratio line openings 121B, 123B, 125B (depicted in FIG. 2C), followed by a planarization process to form a second set of low aspect ratio line segments 231B, 233B, 235B. As depicted by FIG. 2D, second set of low aspect ratio line segments 231B, 233B, 235 are in contact and in vertical alignment with the first set of low aspect ratio line segments 131A, 133A, 135A, respectively.

Conductive metal layer 250B may be formed from the same processes and materials as described above with reference to conductive metal layer 140A. In some embodiments, and as depicted by FIG. 2D, conductive metal layer 250B and conductive metal layer 150A are formed from the same material(s). In other embodiments, conductive metal layer 250B and conductive metal layer 150A are formed from different materials.

Figure 2E:
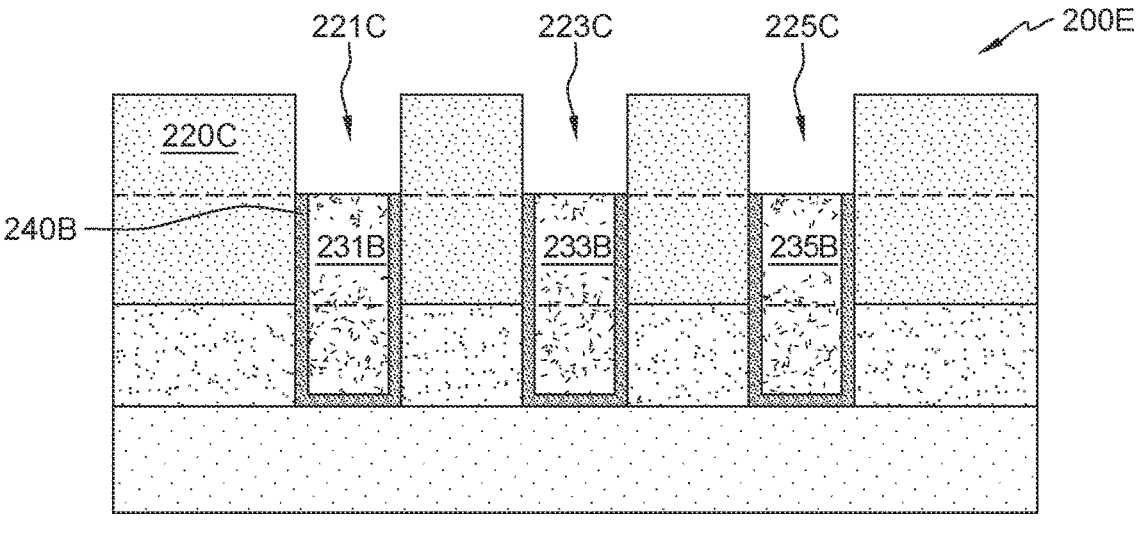
FIG. 2E illustrates a cross-sectional view of semiconductor structure 200D depicted in FIG. 2D after performing subsequent processing steps, generally designated 200E, in accordance with at least one embodiment of the present invention.

FIG. 2E illustrates a cross-sectional view of semiconductor structure 200D depicted in FIG. 2D after performing subsequent processing steps, generally designated 200E, in accordance with at least one embodiment of the present invention. In assembly of semiconductor structure 200E, a dielectric material is selectively deposited onto the top surface of dielectric layer 220B to form a dielectric layer 220C having a third set of low aspect ratio line openings 221C, 223C, 225C. As depicted by FIG. 2E, the third set of low aspect ratio line openings 221C, 223C, 225C are formed above and in vertical alignment with the second set of low aspect ratio line segments 231B, 233B, 235B, respectively.

In forming dielectric layer 220C, a dielectric material that is selective to the material(s) of dielectric layer 220B over the material(s) of barrier layer 240B and conductive metal layer 250B is deposited (e.g., via selective atomic layer deposition (ALD), selective chemical vapor deposition (CVD) or any other suitable deposition techniques) onto the top surface of dielectric layer 220B. Dielectric layer 220C may be formed using any material(s) including, but not limited, to those listed above with respect to dielectric layer 120A, that are selective to the material(s) of dielectric layer 220B over the material(s) of barrier layer 240B and conductive metal layer 150B. In some embodiments, and as depicted by FIG. 2E, dielectric layer 220C and dielectric layer 220B are formed from the same materials. In other embodiments, dielectric layer 220C and dielectric layer 220B are formed from different materials.

Figure 2F:
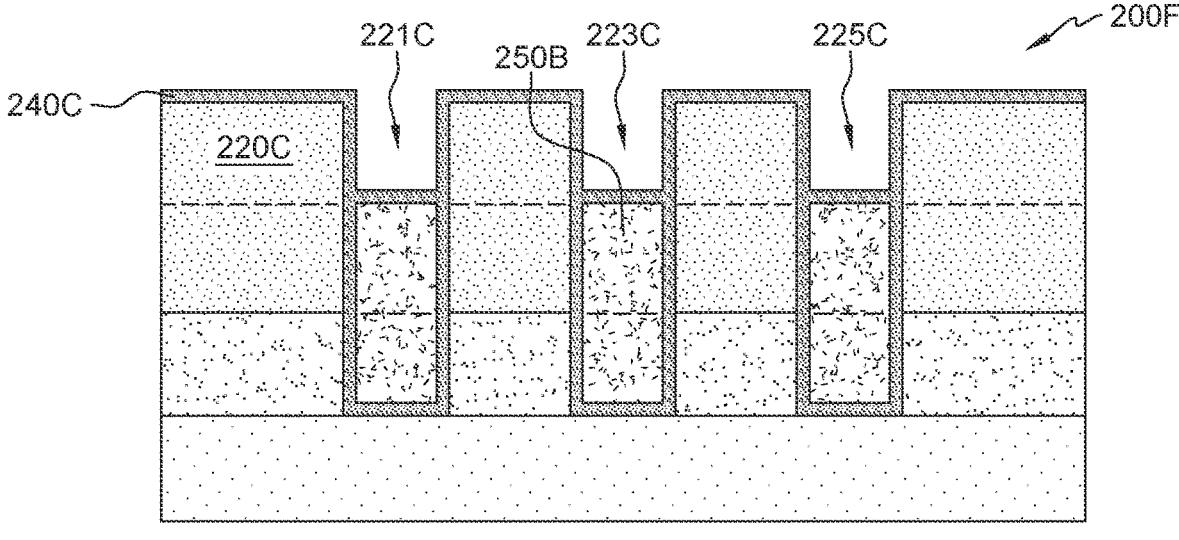
FIG. 2F illustrates a cross-sectional view of semiconductor structure 200E depicted in FIG. 2E after performing subsequent processing steps, generally designated 200F, in accordance with at least one embodiment of the present invention.

FIG. 2F illustrates a cross-sectional view of semiconductor structure 200E depicted in FIG. 2E after performing subsequent processing steps, generally designated 200F, in accordance with at least one embodiment of the present invention. In assembly of semiconductor structure 200F, a metal barrier material is deposited to form a barrier layer 240C.

Barrier layer 240C may be formed by conformally depositing a metal barrier material (e.g., via atomic layer deposition (ALD), chemical vapor deposition (CVD), plasma enhanced CVD (PECVD), or any other suitable deposition techniques) onto the exposed surfaces of the patterned dielectric layer 220C, barrier layer 240B, and conductive metal layer 250B. Barrier layer 240C may be formed using material(s) including, but not limited, to those listed above with respect to barrier 140A. In some embodiments, and as depicted by FIG. 2F, barrier layer 240C and barrier layer 240B are formed from the same material(s). In other embodiments, barrier layer 240C and barrier layer 240B are formed from different materials.

Figures 2G, 2H:
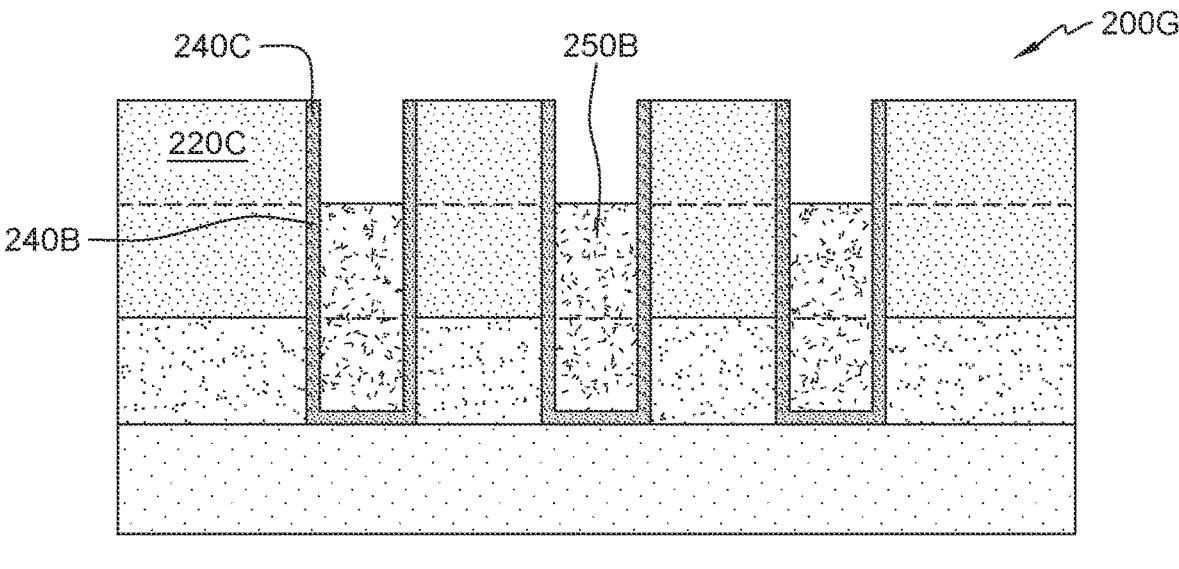
FIG. 2G illustrates a cross-sectional view of semiconductor structure 200F depicted in FIG. 2F after performing subsequent processing steps, generally designated 200G, in accordance with at least one embodiment of the present invention.
FIG. 2H illustrates a cross-sectional view of semiconductor structure 200G depicted in FIG. 2G after performing subsequent processing steps, generally designated 200H, in accordance with at least one embodiment of the present invention.

FIG. 2G illustrates a cross-sectional view of semiconductor structure 200F depicted in FIG. 2F after performing subsequent processing steps, generally designated 200G, in accordance with at least one embodiment of the present invention. In assembly of semiconductor structure 200G, portions of barrier layer 240C previously formed on the top surfaces of dielectric layer 220C and conductive metal layer 250B are removed by an anisotropic etching process such as, for example, reactive ion etching (RIE), ion beam etching (IBE), chemical wet etching, or a combination of IBE and chemical wet etching.

FIG. 2H illustrates a cross-sectional view of semiconductor structure 200G depicted in FIG. 2G after performing subsequent processing steps, generally designated 200H, in accordance with at least one embodiment of the present invention. In assembly of semiconductor structure 200H, a conductive metal layer 250C is formed by depositing a conductive metal material within and filling the third set of low aspect ratio line openings 221C, 223C, 225C (depicted in FIG. 2G), followed by a planarization process to form a third set of low aspect ratio line segments 231C, 233C, 235C. As depicted by FIG. 2H, the third set of low aspect ratio line segments 231C, 233C, 235C are in contact and in vertical alignment with the second set of low aspect ratio line segments 231B, 233B, 235B, respectively.

Conductive metal layer 250C may be formed from the same processes and materials as described above with reference to conductive metal layer 150A. In some embodiments, and as depicted by FIG. 2H, conductive metal layer 250C and conductive metal layer 250B are formed from the same material(s). In other embodiments, conductive metal layer 250C and conductive metal layer 250B are formed from different materials.

As depicted by FIG. 2H, a plurality of high aspect ratio metal lines that are substantially uniform in height and width are formed from multiple low aspect ratio line segments. A first high aspect ratio metal line 261 is formed from low aspect ratio line segments 131A, 131B, and 231C. A second high aspect ratio metal line 263 is formed from low aspect ratio line segments 133A, 133B, and 233C. A third high aspect ratio metal line 265 is formed from low aspect ratio line segments 135A, 135B, and 235C. Although first, second, and third high aspect ratio metal lines 261, 263, 265 are depicted as being formed from three low aspect ratio line segments, embodiments of the present invention are not limited to high aspect ratio metal lines formed from three low aspect ratio line segments. Rather, embodiments of the present invention may contemplate high aspect ratio metal lines formed from more or less than three low aspect ratio line segments. In an embodiment, high aspect ratio metal lines are formed from at least two low aspect ratio line segments. The total number of low aspect ratio lines segments used to form a single high aspect ratio metal line may vary depending on the desired height of the high aspect ratio lines of the interconnect structure. In an embodiment, the pitch between first and second high aspect ratio metal lines 261, 263, and the pitch between second and third high aspect ratio metal lines 263, 265, is less than 30 nanometers. In an embodiment, the pitch between first and second high aspect ratio metal lines 261, 263, and the pitch between second and third high aspect ratio metal lines 263, 265, is greater than or equal to than 30 nanometers.

FIGS. 3 and 4, generally designated 300 and 400, respectfully, are methods of fabricating semiconductor interconnect structures corresponding to the semiconductor structures described with reference to FIGS. 1A-1G and 2A-2H, respectively. The methods of FIGS. 3 and 4 may be used in conjunction with, for example, any of the exemplary fabrication sequences of FIGS. 1A-1G and 2A-2H.

Referring now to FIG. 3, the method 300 optionally begins at block 302, where a first set of low aspect ratio line segments are formed using one or more damascene processes. Forming the first set of low aspect ratio line segments comprises depositing (at block 304) a dielectric material onto a substrate to form a first dielectric layer, patterning (at block 306) the first dielectric layer to form a first set of low aspect ratio line openings, conformally depositing (at block 308) a metal liner material onto the surfaces of the first set of low aspect ratio line openings to form a first metal barrier segment, and depositing (at block 310) a conductive metal material into and filling the first set of low aspect ratio line openings.

At block 312, a second set of low aspect ratio line openings are formed in a second dielectric layer. Forming the second set of low aspect ratio line openings comprises selectively depositing (at block 314) a dielectric material that is selective to the material(s) of the first dielectric layer.

At block 316, a second set of low aspect ratio line segments are formed using one or more damascene processes. Forming the second set of low aspect ratio line segments comprises selectively and conformally depositing (at block 318) a metal barrier material onto the surfaces of the second dielectric layer to form a second metal barrier segment, and depositing (at block 320) a conductive metal material into and filling the second set of low aspect ratio line openings.

At block 322, a third set of low aspect ratio line openings are formed in a third dielectric layer. Forming the third set of low aspect ratio line openings comprises selectively depositing (at block 324) a dielectric material that is selective to the material(s) of the second dielectric layer.

At block 326, a third set of low aspect ratio line segments are formed using one or more damascene processes. Forming the third set of low aspect ratio line segments comprises selectively and conformally depositing (at block 328) a metal barrier material onto the surfaces of the second dielectric layer to form a third metal barrier segment, and depositing (at block 330) a conductive metal material into and filling the third set of low aspect ratio line openings.

Referring now to FIG. 4, the method 400 optionally begins at block 402, where a first set of low aspect ratio line segments are formed using one or more damascene processes. Forming the first set of low aspect ratio line segments comprises depositing (at block 404) a dielectric material onto a substrate to form a first dielectric layer, patterning (at block 406) the first dielectric layer to form a first set of low aspect ratio line openings, conformally depositing (at block 408) a metal liner material onto the surfaces of the first set of low aspect ratio line openings to form a first metal barrier segment, and depositing (at block 410) a conductive metal material into and filling the first set of low aspect ratio line openings.

At block 412, a second set of low aspect ratio line openings are formed in a second dielectric layer. Forming the second set of low aspect ratio line openings comprises depositing (at block 414) a dielectric material that is selective to the material(s) of the first dielectric layer.

At block 416, a second set of low aspect ratio line segments are formed using one or more damascene processes. Forming the second set of low aspect ratio line segments comprises conformally depositing (at block 418) a metal barrier material onto the surfaces of the second dielectric layer and the first set of low aspect ratio line segments to form a second metal barrier segment, removing (at block 420) portions of the second metal barrier segment formed on the top surfaces of the second dielectric layer and the first set of low aspect ratio line segments using an anisotropic etching process, and depositing (at block 422) a conductive metal material into and filling the second set of low aspect ratio line openings.

At block 424, a third set of low aspect ratio line openings are formed in a third dielectric layer. Forming the third set of low aspect ratio line openings comprises depositing (at block 426) a dielectric material that is selective to the material(s) of the second dielectric layer.

At block 428, a third set of low aspect ratio line segments are formed using one or more damascene processes. Forming the third set of low aspect ratio line segments comprises conformally depositing (at block 430) a metal barrier material onto the surfaces of the third dielectric layer and the second set of low aspect ratio segments to form a third metal barrier segment, removing (at block 432) portions of the third metal barrier segment formed on the top surfaces of the third dielectric layer and the second set of low aspect ratio line segments using an anisotropic etching process, and depositing (at block 434) a conductive metal material into and filling the third set of low aspect ratio line openings.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A semiconductor interconnect structure, comprising:
   a first high aspect ratio metal line located within a dielectric layer, wherein the first high aspect ratio metal line includes a first low aspect ratio line segment and a second low aspect ratio line segment; and
   a metal liner located between a sidewall of the first high aspect ratio metal line and the dielectric layer,
   wherein a first portion of the metal liner located between a first sidewall portion of the first low aspect ratio line segment and a bottom portion of the dielectric layer is formed from a different material than a second portion of the metal liner located between a second sidewall portion of the second low aspect ratio line segment and a top portion of the dielectric layer.

2. The semiconductor interconnect structure of claim 1, wherein the first low aspect ratio line segment is located within the bottom portion of the dielectric layer, and the second low aspect ratio line segment is located within the top portion of the dielectric layer.

3. The semiconductor interconnect structure of claim 1, wherein sidewalls of the high aspect ratio metal line are substantially vertical.

4. The semiconductor interconnect structure of claim 1, further comprising:
   a second high aspect ratio metal line located adjacent to the first high aspect ratio metal line, wherein the second high aspect ratio metal line includes a third low aspect ratio line segment and a fourth low aspect ratio line segment, and further wherein the first high aspect ratio metal line and the second high aspect ratio metal line are substantially uniform in height and width.

5. The semiconductor interconnect structure of claim 1, further comprising:
   a second high aspect ratio metal line located adjacent to the first high aspect ratio metal line, wherein the second high aspect ratio metal line includes a third low aspect ratio line segment and a fourth low aspect ratio line segment, and further wherein a pitch between the first high aspect ratio metal line and the second high aspect ratio metal line is below 30 nanometers.

6. The semiconductor interconnect structure of claim 1, wherein the first high aspect ratio line segment is formed from at least one material selected from the group consisting of Ru, W, Co, Rh, Mo, and Ir.

7. The semiconductor interconnect structure of claim 1, wherein the first portion of the metal liner and the second portion of the metal liner are formed from at least one material selected from the group consisting of TiN, TaN, and HfN.

8. The semiconductor interconnect structure of claim 1, wherein the bottom portion of the dielectric layer and the top portion of the dielectric layer are formed from different materials.

9. The semiconductor interconnect structure of claim 1, wherein the top portion of the dielectric layer is formed from parylene, and the bottom portion of the dielectric layer is formed from a dielectric material other than parylene.

\* \* \* \* \*